US012745527B2

(12) United States Patent
Choi et al.

(10) Patent No.: US 12,745,527 B2
(45) **Date of Patent: *Sep. 22, 2026**

(54) DISPLAY DEVICE

(71) Applicant: Samsung Display Co., Ltd., Yongin-Si (KR)

(72) Inventors: Jae-Ho Choi, Seoul (KR); Minchae Kwak, Seoul (KR); Kyeonghwa Kim, Asan-si (KR); Mihae Kim, Asan-si (KR); Kyonghwan Oh, Seoul (KR); Sumi Jang, Asan-si (KR); Seunghan Jo, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/974,430

(22) Filed: Dec. 9, 2024

(65) Prior Publication Data

US 2025/0107372 A1 Mar. 27, 2025

Related U.S. Application Data

(63) Continuation of application No. 17/533,563, filed on Nov. 23, 2021, now Pat. No. 12,167,651.

(30) Foreign Application Priority Data

Dec. 28, 2020 (KR) ........................ 10-2020-0184875

(51) Int. Cl.
*H10K 59/131* (2023.01)
*G09G 3/3233* (2016.01)
*H10K 59/128* (2023.01)

(52) U.S. Cl.
CPC ......... *H10K 59/131* (2023.02); *G09G 3/3233* (2013.01); *H10K 59/128* (2023.02)

(58) Field of Classification Search
CPC .. G09G 3/3208; G09G 3/3225; G09G 3/3233; G09G 3/3275; G09G 2310/0297; G09G 2300/0426; H10K 59/131
See application file for complete search history.

(56) References Cited

U.S. PATENT DOCUMENTS

2015/0199936 A1* 7/2015 Watanabe ............ G09G 3/3685 345/100
2017/0288002 A1 10/2017 Kim et al.
(Continued)

FOREIGN PATENT DOCUMENTS

CN 109061972 A 12/2018
CN 109754753 A 5/2019
(Continued)

OTHER PUBLICATIONS

Extended European Search Report for Application No. 21207660.8-1210 dated May 6, 2022 enumerating the listed reference in the Extended European Search Report.

*Primary Examiner* — Priyank J Shah
(74) *Attorney, Agent, or Firm* — CANTOR COLBURN LLP

(57) ABSTRACT

A display device includes a substrate on which a display area including a plurality of pixels and a non-display area surrounding the display area are defined, a first voltage line disposed on the substrate in the non-display area, where the first voltage line provides a first voltage to the pixels, a second voltage line disposed on the substrate in the non-display area, where the second voltage line provides a second voltage to the pixels, and a first demux circuit area and a second demux circuit area disposed on the substrate in the non-display area, where the first demux circuit area and the second demux circuit area transmit data signals to the (Continued)

pixels. The first voltage line passes an area between the first demux circuit area and the second demux circuit area.

27 Claims, 13 Drawing Sheets

(56) References Cited

U.S. PATENT DOCUMENTS

| | | | | |
|---|---|---|---|---|
| 2019/0140036 | A1* | 5/2019 | Hyeon | G09G 3/3275 345/76 |
| 2020/0202784 | A1 | 6/2020 | Kim et al. | |
| 2020/0243021 | A1 | 7/2020 | Li et al. | |
| 2020/0303421 | A1 | 9/2020 | Cho et al. | |
| 2021/0036093 | A1 | 2/2021 | Okabe et al. | |

FOREIGN PATENT DOCUMENTS

| | | | |
|---|---|---|---|
| CN | 111463235 | A | 7/2020 |
| CN | 111937489 | A | 11/2020 |
| KR | 20170114028 | A | 10/2017 |
| KR | 20200078806 | A | 7/2020 |
| KR | 20200113132 | A | 10/2020 |

* cited by examiner

FIG. 4

VC1
VL3
V06
V05
V04
V03
V02
V01
VL1
VL2 VL1
VLA2
VLA1
II'
II
I
I'
DXA2
DXA1
VP
B
DR1
DR2

FIG. 5

VL3
VC2
V06
V05
VL1
VL2
V04
V03
VLA2
V02
VLA1
DXA2
V01
VP
DXA1
B
DR1
DR2

DXA2
DC
DIL
DOL
DXA1
B
DR1
DR2

DISPLAY DEVICE

This application is a continuation of U.S. patent application Ser. No. 17/533,563, fled on Nov. 23, 2021, which claims priority to Korean Patent Application No. 10-2020-0184875, filed on Dec. 28, 2020, and all the benefits accruing therefrom under 35 U.S.C. § 119, the content of which in its entirety is herein incorporated by reference.

BACKGROUND

1. Field

Embodiments relate to a display device, and particularly, a display device including a plurality of lines.

2. Description of the Related Art

Recently, interest in display devices is increasing. Accordingly, the display device is manufactured in various types, including an organic light emitting display device, a liquid crystal display device, and a quantum-dot nano light emitting display device.

In addition, a form of the display device has been diversified. For example, the display device may have a shape such as a circle or a polygon. Alternatively, the display device may have a shape in which each vertex of a polygon has a curvature.

A plurality of lines may be disposed in a non-display area of the display device. For example, a low power voltage line, an initialization voltage line, a high power voltage line, and a data line may be disposed in a non-display area of a circular display device. In such a circular display device, a dead space may be formed by a space in which the low power voltage line, the initialization voltage line, the high power voltage line, and the data line are disposed.

SUMMARY

Embodiments provide a display device with reduced dead space.

According to an embodiment, a display device includes a substrate on which a display area including a plurality of pixels and a non-display area surrounding the display area are defined, a first voltage line disposed on the substrate in the non-display area, where the first voltage line provides a first voltage to the pixels, a second voltage line disposed on the substrate in the non-display area, where the second voltage line provides a second voltage to the pixels, and a first demux circuit area and a second demux circuit area disposed on the substrate in the non-display area, where the first demux circuit area and the second demux circuit area transmit data signals to the pixels. In such an embodiment, the first voltage line passes an area between the first demux circuit area and the second demux circuit area.

In an embodiment, the display area may have a circular shape.

In an embodiment, the display device may further include a first voltage bypass line connected to the first voltage line and disposed along an edge of the display area and a second voltage bypass line connected to the second voltage line and disposed along the edge of the display area.

In an embodiment, the first voltage may be an initialization voltage, and the second voltage may be a low power supply voltage.

In an embodiment, the first voltage may be a low power voltage, and the second voltage may be an initialization voltage.

In an embodiment, the first demux circuit area and the second demux circuit area may be disposed to be spaced apart in one direction.

In an embodiment, the display device may further include a third voltage line disposed on the substrate in the non-display area, where the third voltage line may provide a third voltage to the pixels.

In an embodiment, the third voltage may be a high power voltage.

In an embodiment, a part of the third voltage line may pass the area between the first demux circuit area and the second demux circuit area.

In an embodiment, a width of the part of the third voltage line may be narrower than a width of another part of the third voltage line connected to the part.

In an embodiment, the display device may further include a plurality of voltage output lines connected to the first voltage line.

In an embodiment, some of the voltage output lines may partially overlap the first demux circuit area, and others of the voltage output lines except for the some partially may overlap the second demux circuit area.

In an embodiment, the display device may further include a voltage transmission line connected to the first voltage line. In such an embodiment, at least some of the voltage output lines may be connected to the first voltage line by the voltage transmission line.

In an embodiment, some of the voltage transmission lines may overlap the first demux circuit area, and others of the voltage transmission lines except for the some may overlap the second demux circuit area.

In an embodiment, the first voltage line and the voltage output line may be disposed in different layers from each other.

In an embodiment, the plurality of voltage output lines may be disposed in a same layer as each other.

In an embodiment, at least some of the plurality of voltage output lines may be disposed in different layers from each other.

In an embodiment, the first demux circuit area may include a first demux circuit to which a first data signal is applied through a first data input line, and the second demux circuit area may include a second demux circuit to which a second data signal is applied through a second data input line.

In an embodiment, the first data input line and the second data input line may be disposed in a same layer as each other.

In an embodiment, the first data input line and the second data input line may be disposed in different layers from each other.

In an embodiment, the display device may further include a first data output line and a second data output line, which are connected to the first demux circuit and a third data output line and a fourth data output line, which are connected to the second demux circuit.

In an embodiment, the first to fourth data output lines may be disposed in a same layer as each other.

In an embodiment, at least one selected from the first to fourth data output lines may be disposed in a different layer from another selected therefrom.

In an embodiment, the first voltage line may include a first part disposed between the first demux circuit and the second demux circuit, and a second part connected to the first part, and a width of the first part may be narrower than a width of the second part.

According to embodiments, the display device may include a substrate on which a display area including a plurality of pixels and a non-display area surrounding the display area are defined, a first voltage line disposed on the substrate in the non-display area to provide a first voltage to the pixels, a second voltage line disposed on the substrate in the non-display area to provide a second voltage to the pixels, and a first demux circuit area and a second demux circuit area disposed on the substrate in the non-display area to transmit data signals to the pixels. In such embodiments, the first voltage line may pass an area between the first demux circuit area and the second demux circuit area.

Accordingly, in such embodiments of the display device, the non-display area at the lower end of the display device may be reduced compared to a case where the first voltage line is disposed to bypass a demux circuit area.

BRIEF DESCRIPTION OF THE DRAWINGS

Features of embodiments of the invention will be more clearly understood from the following detailed description taken in conjunction with the accompanying drawings.

FIG. 4 is a diagram illustrating an embodiment in which area B of the display device of FIG. 1 is enlarged.

FIG. 5 is a diagram illustrating an embodiment in which area B of the display device of FIG. 1 is enlarged.

DETAILED DESCRIPTION

Figure 1:
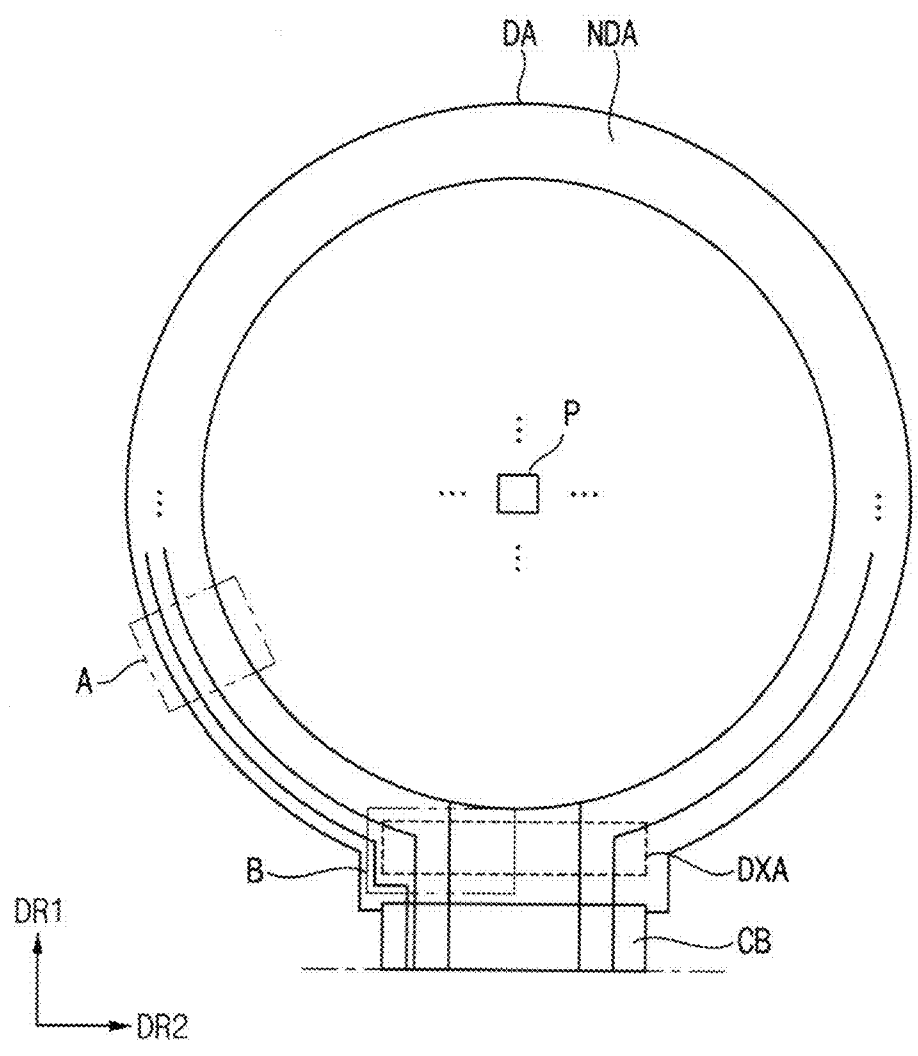
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
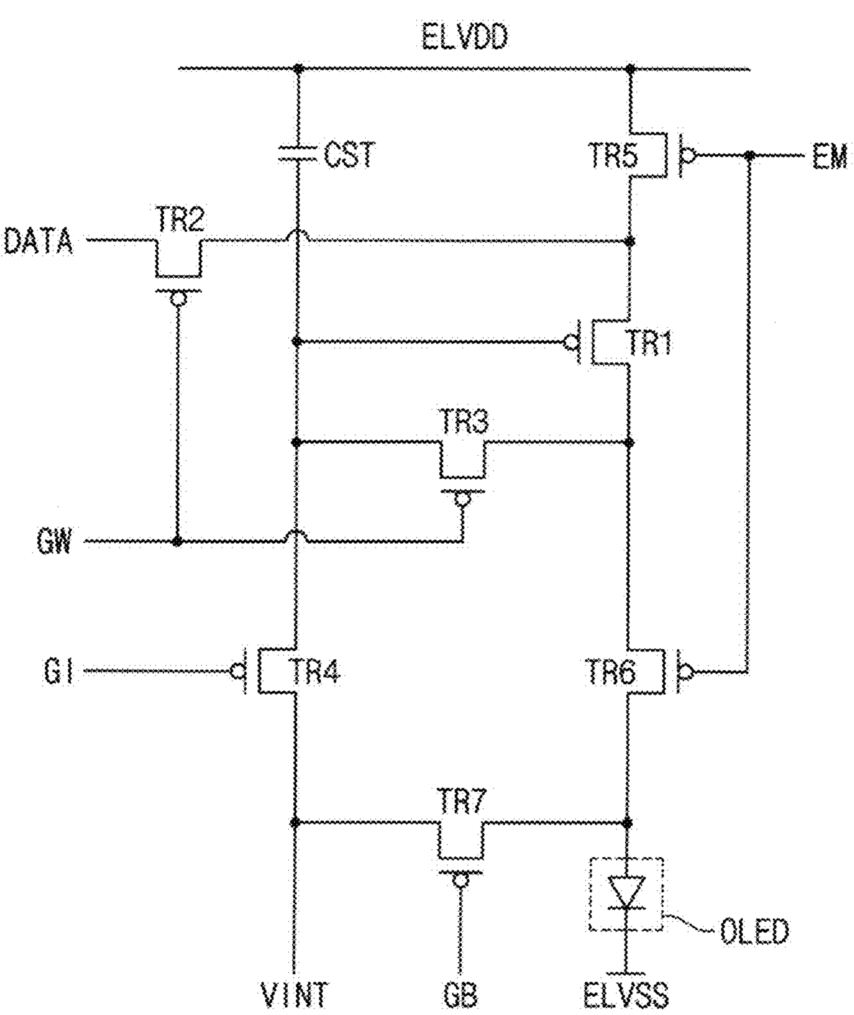
FIG. 2 is a circuit diagram illustrating a pixel included in the display device of FIG. 1.

FIG. 1 is a plan view illustrating a display device according to an embodiment, and FIG. 2 is a circuit diagram illustrating a pixel included in the display device of FIG. 1.

Referring to FIGS. 1 and 2, an embodiment of the display device may include a display area DA and a non-display area NDA surrounding the display area DA. In an embodiment, the display area DA may have a curvature. In an embodiment, for example, the display area DA may have a circular shape having a constant curvature as a whole. Alternatively, the display area DA may include a part having a linear shape or a straight outer side, and another part having a shape having a curvature or a curved outer side.

A plurality of pixels P may be disposed in the display area DA. The pixels P may be arranged in various shapes in the display area DA. In an embodiment, for example, the pixels P may be entirely arranged in a matrix form in the display area DA. Alternatively, the pixels P may be arranged in a matrix form in a central part of the display area DA, and may be arranged in a stepwise manner at a edge of the display area DA. In such embodiments, the pixels P may be arranged in various shapes corresponding to a shape of the display area DA for displaying an image thereon.

Each of the pixels P may include at least one transistor and at least one capacitor. FIG. 2 illustrates an embodiment of a pixel including seven transistors and a single capacitor. In an embodiment, each of the pixels P may include first to seventh transistors TR1, TR2, TR3, TR4, TR5, TR6, TR7, and a storage capacitor CST, as shown in FIG. 2. In an embodiment, the display device may be an organic light emitting display device, and each of the pixels P may further include an organic light emitting diode OLED. Alternatively, each of the pixels P may include three transistors and a single capacitor. In such embodiments, each of the pixels P may include various numbers of transistors and capacitors for driving the pixels P.

In an embodiment, as shown in FIG. 2, each of the pixels P may receive a data signal DATA, gate signals GW, GI, GB, an light emitting signal EM, a high power voltage ELVDD, a low power voltage ELVSS, and an initialization voltage VINT, but not being limited thereto. Alternatively, an additional voltage (e.g., a compensation voltage) may be further applied to each of the pixels P.

The non-display area NDA may have a shape corresponding to the shape of the display area DA. In an embodiment, for example, the display area DA may have a circular shape, and the non-display area NDA may have a circular shape (or a circular band shape) having a same curvature as the display area DA. Alternatively, the non-display area NDA may have a shape independent from the display area DA. In an embodiment, for example, the display area DA may have a circular shape, and the non-display area NDA may have a polygonal shape.

In an embodiment, a plurality of demux circuits may be disposed on one side portion of the non-display area NDA. Each of the demux circuits may output the data signal DATA through a plurality of data output lines after receiving the data signal DATA from a data input line. In such an embodiment, the display device may efficiently utilize a space in which the lines are arranged in the non-display area NDA. The demux circuits may be disposed in a demux circuit area DXA. The demux circuit area DXA may be disposed adjacent to the display area DA. In an embodiment, the demux circuit area DXA and the display area DA may be disposed adjacent to each other in a first direction DR1. The demux circuit area DXA may extend in a second direction DR2 perpendicular to the first direction DR1. In such an embodiment, the demux circuits may be arranged in parallel in the second direction DR2. Alternatively, the demux circuit area DXA may extend to correspond to the curvature of the display area DA. In such an embodiment, the demux circuits may be disposed along the edge of the display area DA.

In an embodiment, a circuit board CB may be disposed on one side of the non-display area NDA. The circuit board CB may transmit various signals and voltages to the pixels P. The circuit board CB may be disposed on or to overlap the non-display area NDA, or may be disposed to be connected to the non-display area NDA by a separate film. Lines extending from the circuit board CB may be connected to the display area DA after passing through the non-display area NDA. FIG. 1 shows only a portion of the lines for convenience of illustration, and the display device may include more lines. The lines may be entirely disposed along the edge of the display area DA, or may be disposed only in a part of the edge.

Figure 3:
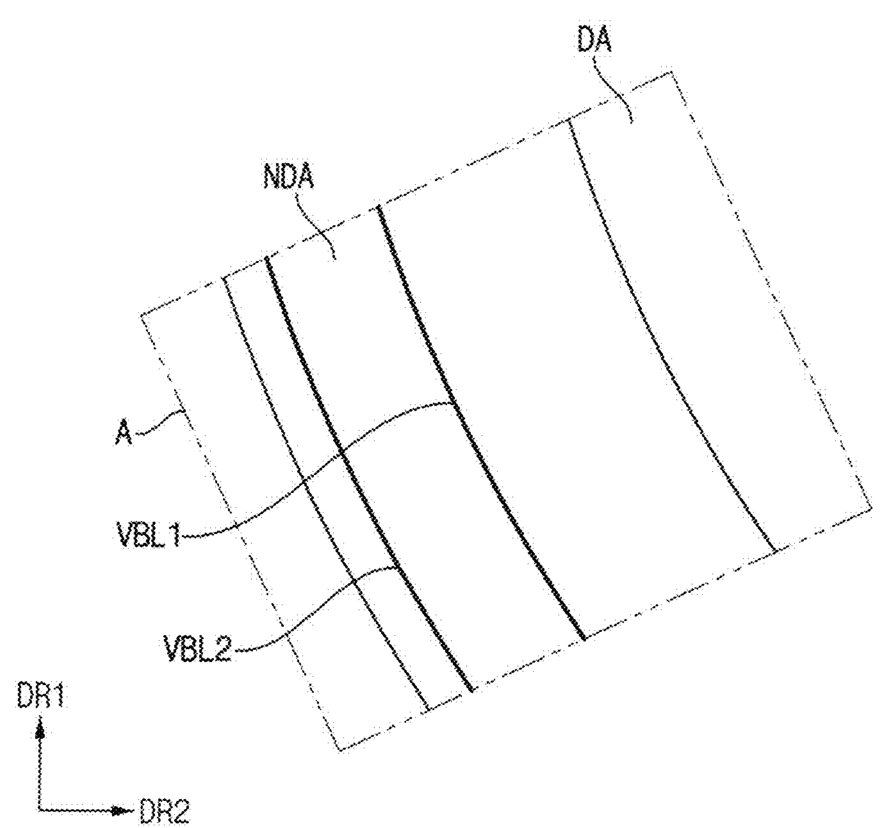
FIG. 3 is a diagram illustrating an embodiment in which area A of the display device of FIG. 1 is enlarged.

FIG. 3 is a diagram illustrating an embodiment in which area A of the display device of FIG. 1 is enlarged.

Referring to FIGS. 1 and 3, an embodiment of the display device may include a plurality of lines. In an embodiment, some of the lines may be disposed along the edge of the display area DA. In an embodiment, for example, a first voltage bypass line VBL1 and a second voltage bypass line VBL2 may be disposed along the edge of the display area DA. In such an embodiment, each of the first voltage bypass line VBL1 and the second voltage bypass line VBL2 may have a curvature. Each of the first voltage bypass line VBL1 and the second voltage bypass line VBL2 may be connected to voltage lines to be described later. The first voltage bypass line VBL1 may be connected to the pixels P by a plurality of lines. The second voltage bypass line VBL2 may be connected to the pixels P by a plurality of lines.

Figure 4:
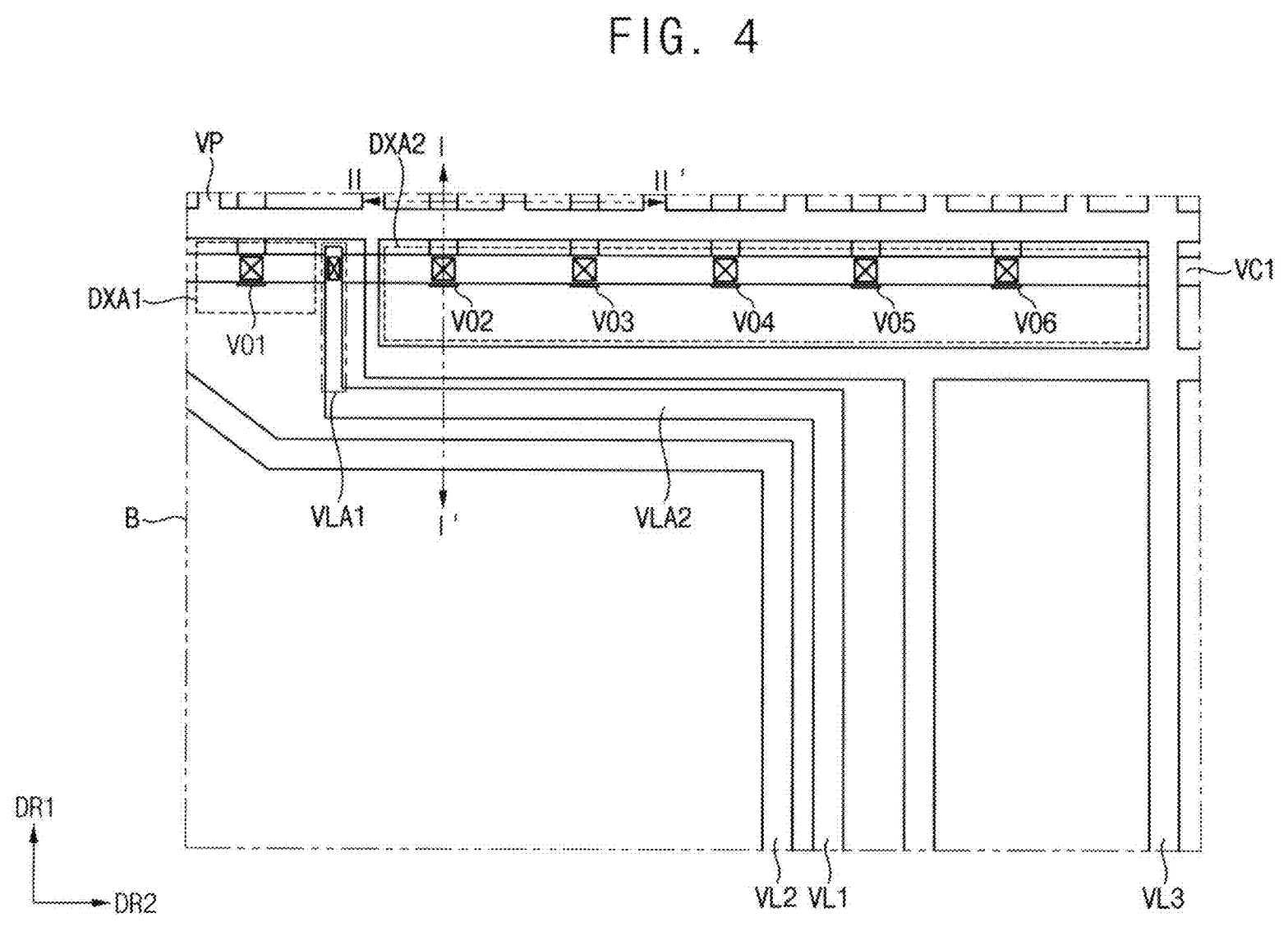

FIG. 4 is a diagram illustrating an embodiment in which area B of the display device of FIG. 1 is enlarged.

Referring to FIGS. 1, 2, 3 and 4, an embodiment of the display device may include a first voltage line VL1, a second voltage line VL2, a third voltage line VL3, a first voltage transmission line VC1, first to sixth voltage output lines VO1, VO2, VO3, VO4, VO5, VO6. In an embodiment, the display device may include a first demux circuit area DXA1 and a second demux circuit area DXA2. In an embodiment, a demux circuit (e.g., one or more demux circuits) may be disposed in each of the first demux circuit area DXA1 and a second demux circuit area DXA2.

In an embodiment, a first voltage may be applied to the first voltage line VL1. In an embodiment, the initialization voltage VINT may be applied to the first voltage line VL1 as the first voltage. In such an embodiment, the first voltage line VL1 may pass (or extend through) an area between the first demux circuit area DXA1 and the second demux circuit area DXA2. The first demux circuit area DXA1 and the second demux circuit area DXA2 may be spaced apart from each other by the first voltage line VL1. In such an embodiment, unlike the second voltage line VL2, the first voltage line VL1 does not bypass the first demux circuit area DXA1, thereby reducing the non-display area NDA of the display device.

In an embodiment, the first voltage line VL1 may be connected to the first voltage transmission line VC1 through a contact hole. The first voltage transmission line VC1 may be connected to the first to sixth voltage output lines VO1, VO2, VO3, VO4, VO5, VO6 through a contact hole, respectively. The initialization voltage VINT flowing through the first voltage line VL1 may be transferred to the pixels P through the first voltage transmission line VC1 and the first to sixth voltage output lines VO1, VO2, VO3, VO4, VO5, VO6.

The first voltage transmission line VC1 may be partially disposed to overlap the first demux circuit area DXA1 and the second demux circuit area DXA2. The first to sixth voltage output lines VO1, VO2, VO3, VO4, VO5, VO6 may be partially disposed to overlap the first demux circuit area DXA1 and the second demux circuit area DXA2. In an embodiment, the first to sixth voltage output lines VO1, VO2, VO3, VO4, VO5, VO6 may pass an area between the demux circuits. The demux circuits and the first to sixth voltage output lines VO1, VO2, VO3, VO4, VO5, VO6 may be disposed not to overlap each other.

In an embodiment, the first voltage transmission line VC1 and the first to sixth voltage output lines VO1, VO2, VO3, VO4, VO5, VO6 may be disposed on different layers. In an embodiment, as illustrated in FIG. 4, the first voltage transmission line VC1 may be disposed above the first to sixth voltage output lines VO1, VO2, VO3, VO4, VO5, VO6. Alternatively, the first voltage transfer line VC1 may be disposed below the first to sixth voltage output lines VO1, VO2, VO3, VO4, VO5, and VO6.

In an embodiment, the first voltage transmission line VC1 may be connected to the first voltage bypass line VBL1. In an embodiment, for example, the first voltage transmission line VC1 may be integrally formed with the first voltage bypass line VBL1 as a single unitary unit. Alternatively, the first voltage transmission line VC1 may be connected to the first voltage bypass line VBL1 through a contact hole.

In an embodiment, the initialization voltage VINT may flow along the edge of the display area DA through the first voltage bypass line VBL1. In such an embodiment, the first voltage bypass line VBL1 may apply the initialization voltage VINT to the pixels P by lines connecting the first voltage bypass line VBL1 and the pixels P.

The first voltage line VL1 may include a first part VLA1 disposed between the first demux circuit area DXA1 and the second demux circuit area DXA2, and a second part VLA2 connected to the first part VLA2. In an embodiment, a width of the first part VLA1 may be narrower than a width of the second part VLA2. In such an embodiment where the width of the first portion VLA1 is narrower than the width of the second part VLA2, an area between the first demux circuit area DXA1 and the second demux circuit area DXA2 that are spaced apart from each other may be minimized.

A second voltage different from the first voltage may be applied to the second voltage line VL2. In an embodiment, the low power voltage ELVSS may be applied to the second voltage line VL2 as the second voltage. The second voltage line VL2 may be connected to the second voltage bypass line VBL2. In an embodiment, the low power voltage ELVSS may flow along the edge of the display area DA through the second voltage bypass line VBL2. In such an embodiment, the second voltage bypass line VBL2 may apply the low power voltage ELVSS to the pixels P by lines connecting the second voltage bypass line VBL2 and the pixels P.

In an embodiment, the low power voltage ELVSS may be applied to the first voltage line VL1, and the initialization voltage VINT may be applied to the second voltage line VL2.

As described above, in an embodiment of the display device, the first voltage bypass line VBL1 may be connected to the first voltage line VL1 passing between the first demux circuit area DXA1 and the second demux circuit area DXA2, thereby reducing the non-display area NDA at the lower part of the display device. In such an embodiment of the display device, the non-display area NDA at the lower part of the display device may be reduced compared to a case where the first voltage line VL1 is turned to the outside of the demux circuit area DXA and is connected to the first voltage bypass line VBL1.

A third voltage different from the first voltage and the second voltage may be applied to the third voltage line VL3. In embodiments, the high power voltage ELVDD may be applied to the third voltage line VL3 as the third voltage. The high power voltage ELVDD may be applied to the third voltage line VL3 by a plurality of input units. The third voltage line VL3 may be disposed to surround the second demux circuit area DXA2. On a plan view, a plurality of demux circuits may be disposed between the third voltage line VL3. The first demux circuit area DXA1 and the second demux circuit area DXA2 may be spaced apart from each other by the third voltage line VL3. The third voltage line VL3 may provide the high power voltage ELVDD to the pixels P by a plurality of output units VP.

In an embodiment, the first demux circuit area DXA1 and the second demux circuit area DXA2 may be spaced apart by the third voltage line VL3. In an embodiment, a width of a first part of the third voltage line VL3 disposed between the first demux circuit area DXA1 and the second demux circuit area DXA2 may be narrower than a width of other part of the third voltage line VL3 connected to the first part, such that a space between the first demux circuit area DXA1 and the second demux circuit area DXA2, which are spaced apart from each other, may be minimized.

Figure 5:
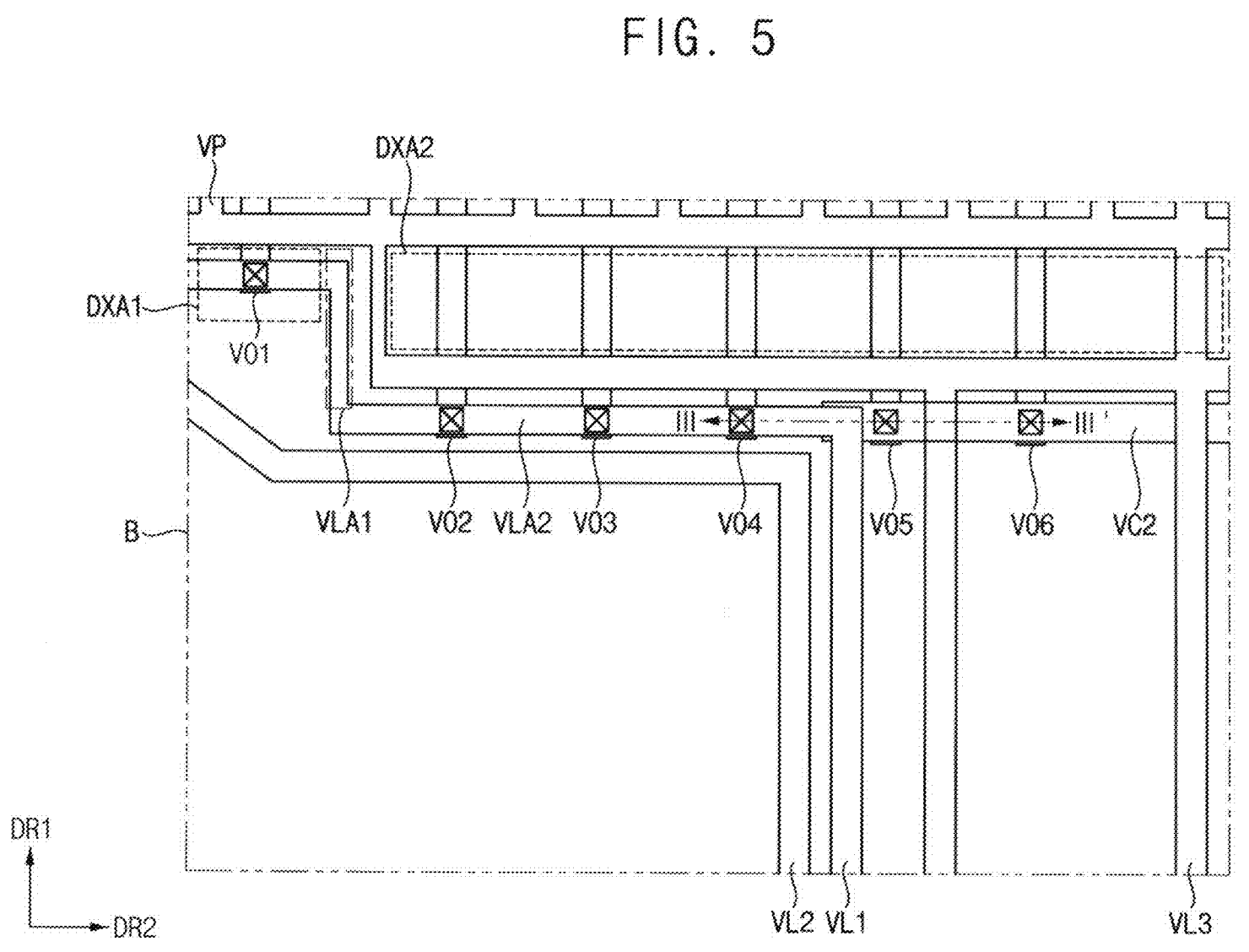

FIG. 5 is a diagram illustrating an embodiment in which area B of the display device of FIG. 1 is enlarged. FIG. 5 may be substantially the same as FIG. 4 except for lines to which the initialization voltage VINT is applied. The same or like elements shown in FIG. 5 have been labeled with the same reference characters as used above to describe the embodiment of the display device shown in FIG. 1, and any repetitive detailed description thereof will hereinafter be omitted or simplified.

Referring to FIGS. 1, 2, 3 and 5, in an embodiment, the first voltage line VL1 may be directly connected to the first to fourth voltage output lines VO1, VO2, VO3, VO4 through a contact hole. In such an embodiment, the first voltage line VL1 may be connected to the second voltage transmission line VC2 through a contact hole, and the fifth and sixth voltage output lines VO5, VO6 may be connected to the second voltage transmission line VC2 through a contact hole. In such an embodiment, the fifth and sixth voltage output lines VO5, VO6 may be connected to the first voltage line VL1 by the second voltage transmission line VC2. The second voltage transmission line VC2 may be disposed to be spaced apart from the second demux circuit area DXA2. In such an embodiment, the second voltage transmission line VC2 may not overlap the second demux circuit area DXA2. In such an embodiment, the first to sixth voltage output lines VO1, VO2, VO3, VO4, VO5, VO6 may partially overlap the second demux circuit area DXA2.

In an embodiment, the first voltage line VL1 may be connected to the first bypass line VBL1. In an embodiment, for example, the first voltage line VL1 may be integrally formed with the first voltage bypass line VBL1 as a single unitary unit. Alternatively, the first voltage line VL1 may be connected to the first voltage bypass line VBL1 through a contact hole.

In such an embodiment, the first voltage line VL1 passes an area between the first demux circuit area DXA1 and the second demux circuit area DXA2 and is connected to the first voltage bypass line VBL1, such that the area of the lower end of the non-display area NDA of the display device may be reduced.

Figure 6:
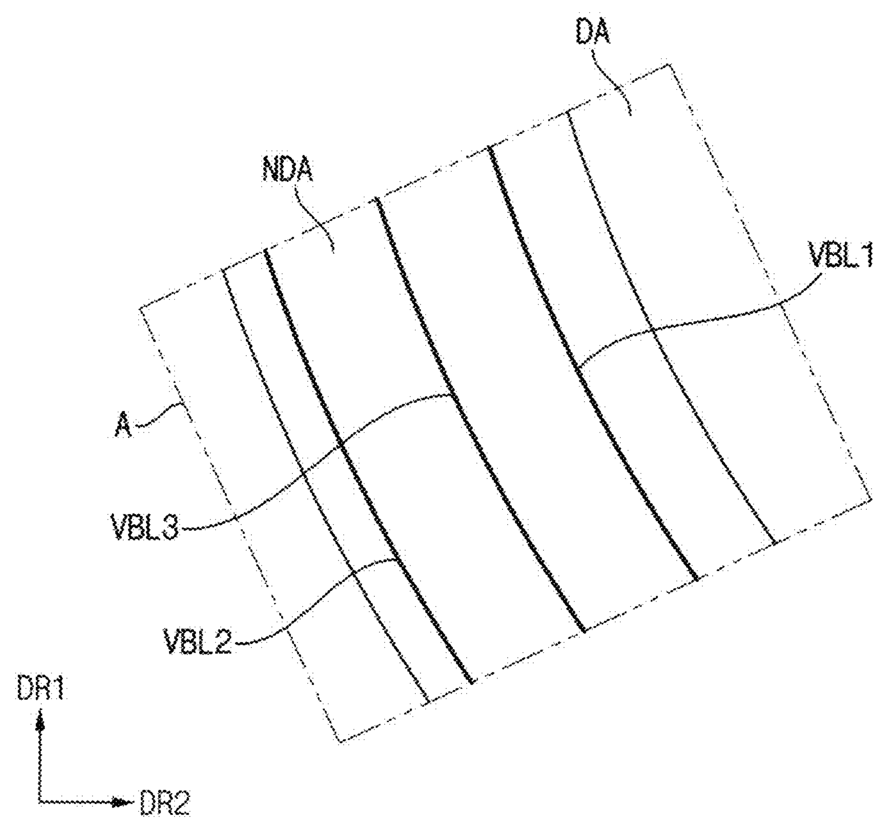
FIG. 6 is a diagram illustrating an embodiment in which area A of the display device of FIG. 1 is enlarged.

FIG. 6 is a diagram illustrating an embodiment in which area A of the display device of FIG. 1 is enlarged.

Referring to FIGS. 1 and 6, an embodiment of the display device may include a plurality of lines. the plurality of lines may be disposed along an edge of the display area DA. In an embodiment, for example, a first voltage bypass line VBL1, a second voltage bypass line VBL2 and a third voltage bypass line VBL3 may be disposed along the edge of the display area DA. In such an embodiment, each of the first voltage bypass line VBL1, the second voltage bypass line VBL2, and the third voltage bypass line VBL3 may have a curvature. Each of the first voltage bypass line VBL1, the second voltage bypass line VBL2, and the third voltage bypass line VBL3 may be connected to voltage lines to be described later. Each of the first voltage bypass line VBL1, the second voltage bypass line VBL2, and the third voltage bypass line VBL3 may be connected to the pixels P by separate lines.

Figure 7:
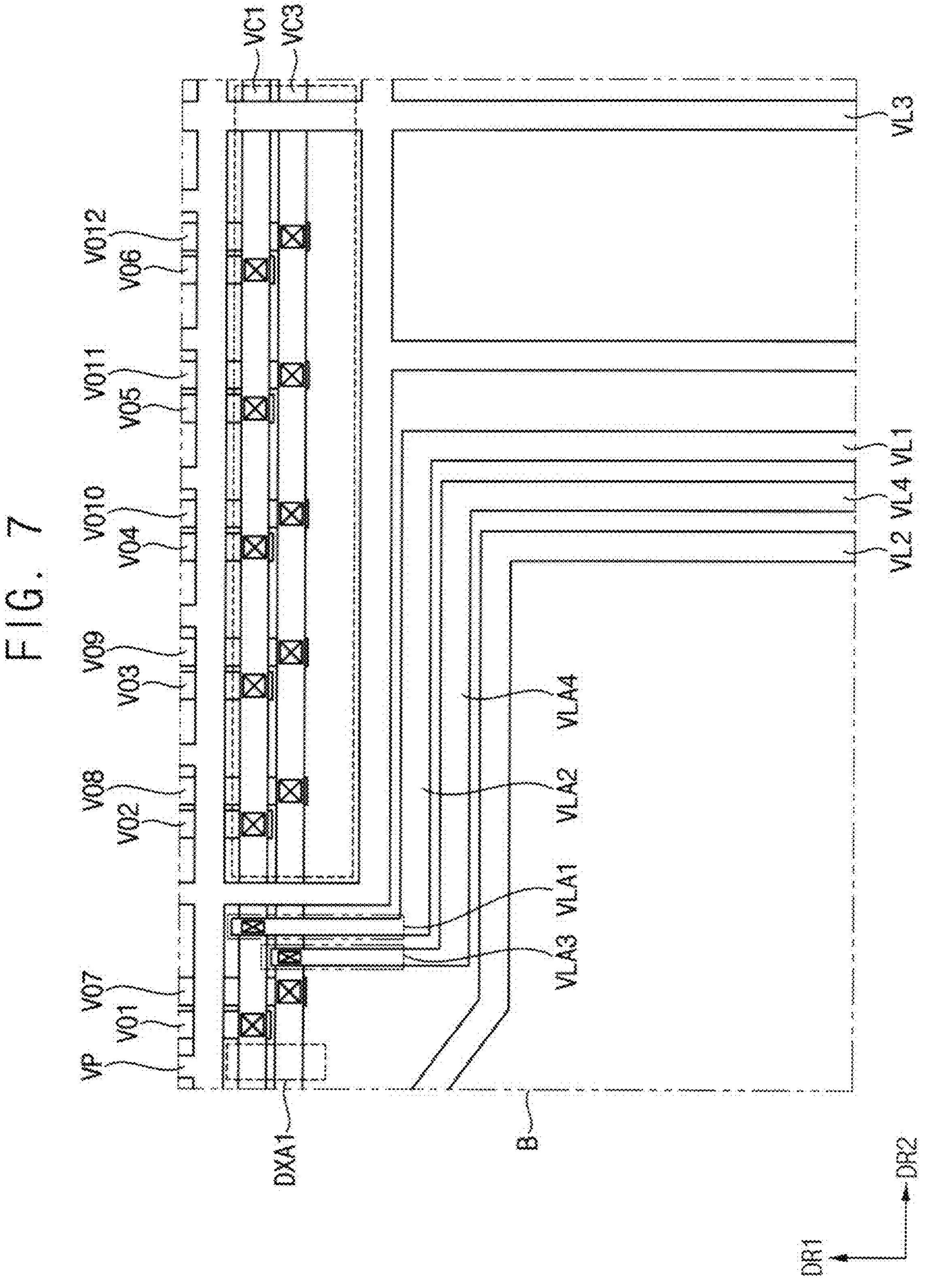
FIG. 7 is a diagram illustrating an embodiment in which area B of the display device of FIG. 1 is enlarged.

FIG. 7 is a diagram illustrating an embodiment in which area B of the display device of FIG. 1 is enlarged.

Referring to FIGS. 1, 2, 6 and 7, an embodiment of the display device may include a first voltage line VL1, a second voltage line VL2, a third voltage line VL3, a fourth voltage line VL4, a first voltage transmission line VC1, a third voltage transmission line VC3, first to sixth voltage output lines VO1, VO2, VO3, VO4, VO5, VO6 and seventh to twelfth voltage output lines VO7, VO8, VO9, VO10, VO11, VO12. In an embodiment, the display device may include a first demux circuit area DXA1 and a second demux circuit area DXA2. In an embodiment, a demux circuit may be disposed in each of the first demux circuit area DXA1 and the second demux circuit area DXA2.

The fourth voltage line VL4 may be disposed between the first voltage line VL1 and the second voltage line VL2. An additional voltage may be applied to the fourth voltage line VL4 as desired. The fourth voltage line VL4 may be connected to the third voltage transmission line VC3. The third voltage transmission line VC may be connected to the seventh to twelfth voltage output lines VO7, VO8, VO9, VO10, VO11, VO12 through a contact hole. The seventh to twelfth voltage output lines VO7, VO8, VO9, VO10, VO11, VO12 are connected to the pixels P, respectively, to provide the additional voltage to the pixels P. The voltage applied to the fourth voltage line VL4 is applied to the pixels P through the third transmission line VC3 and the seventh to twelfth voltage output lines VO7, VO8, VO9, VO10, VO11, VO12. In an embodiment, the third voltage transmission line VC3 may partially overlap the first demux circuit area DXA1 and the second demux circuit area DXA2. In such an embodiment, the first to twelfth voltage output lines VO1, VO2, VO3, VO4, VO5, VO6, VO7, VO8, VO9, VO10, VO11, VO12 may also partially overlap the first demux circuit area DXA1 and the second demux circuit area DXA2. In such an embodiment, the first to twelfth voltage output lines VO1, VO2, VO3, VO4, VO5, VO6, VO7, VO8, VO9, VO10, VO11, VO12 may not overlap the demux circuits.

In an embodiment, the fourth voltage line VL4 and the seventh to twelfth voltage output lines VO7, VO8, VO9, VO10, VO11, VO12 may be disposed in different layers from each other.

In an embodiment, the fourth voltage line VL4 may include a first part VLA3 disposed between the first demux circuit area DXA1 and the second demux circuit area DXA2 and a second part VLA4 connected to the first part VLA3. In such an embodiment, the first part VLA3 may have a narrower width than the second part VLA4, such that an area between the first demux circuit area DXA1 and the second demux circuit area DXA2, which are spaced apart from each other, may be minimized.

Figure 8A:
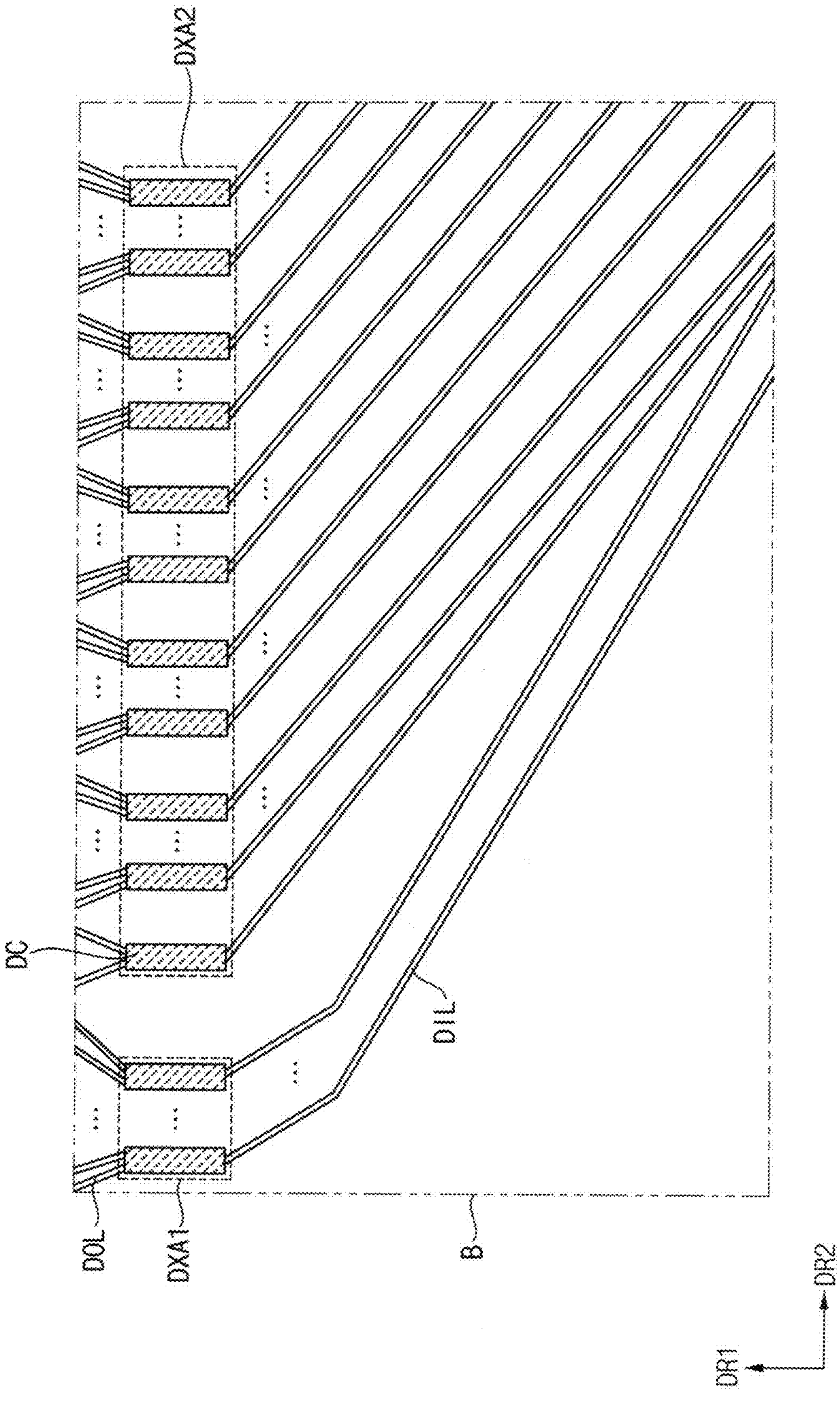
FIG. 8A is a diagram illustrating an embodiment in which area B of the display device of FIG. 1 is enlarged.
Figure 8B:
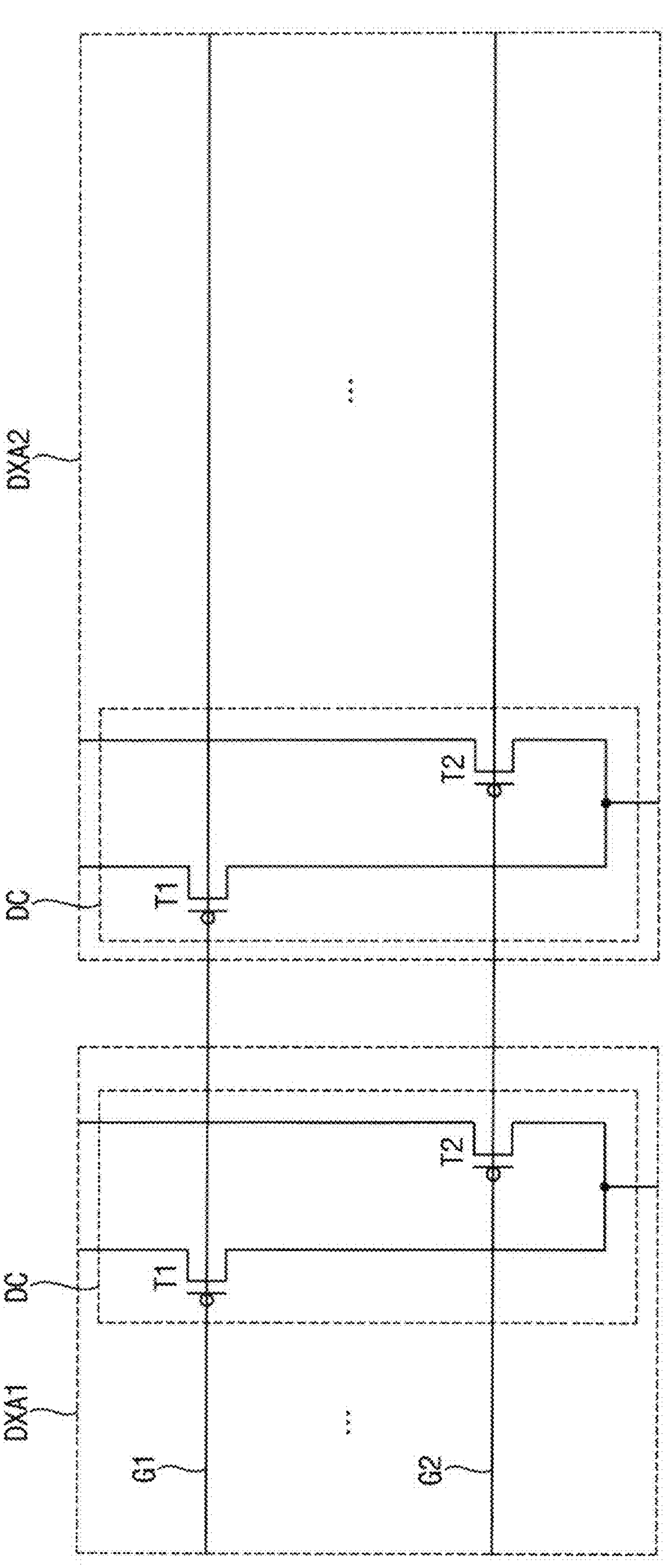
FIG. 8B is a diagram schematically illustrating a structure of a demux circuit illustrated in FIG. 8A.

FIG. 8A is a diagram illustrating an embodiment in which area B of the display device of FIG. 1 is enlarged, and FIG. 8B is a diagram schematically illustrating a structure of a demux circuit illustrated in FIG. 8A.

Referring to FIGS. 1, 2 and 8A, in an embodiment, at least one demux circuit DC may be disposed in each of the first demux circuit area DXA1 and the second demux circuit area DXA2. Each of the demux circuits DC may be connected to data input lines DIL. The data signal DATA transmitted from the circuit film CF may be transmitted to the demux circuits DC through the data input lines DIL. Each of the demux circuits DC may transmit the data signal DATA to the pixels P through data output lines DOL. In an embodiment, as shown in FIG. 8A, two data output lines DOL are connected to one demux circuit DC, for example, but not being limited thereto. In one alternative embodiment, for example, the demux circuits DC may also be connected to three or more data output lines DOL. Alternatively, some of the demux circuits DC may be connected to n data output lines DOL, and the rest of the demux circuits DC may be connected to m data output lines DOL (however, n and m is a natural number of 2 or greater). The data input lines DIL and the data output lines DOL connected to the pixels P may be efficiently connected through the demux circuit DC. Each of the voltage output lines described above with reference to FIGS. 4 to 7 may be disposed between the demux circuits DC. In such an embodiment, the voltage output lines may not overlap the demux circuits DC.

Referring to FIGS. 8A and 8B, each of the demux circuits DC may include at least two transistors T1, T2. The demux circuits DC may be connected to a first signal line G1 and a second signal line G2, respectively. A signal may selectively flow through the first signal line G1 and the second signal line G2. When the first signal line G1 transmits a signal to the first transistor T1, the first transistor T1 may be turned on. When the first transistor T1 is turned on, the data signal DATA of FIG. 2 may be output to the data output line DOL through the first transistor T1. In such an embodiment, when the second signal line G2 transmits a signal to the second transistor T2, the second transistor T2 may be turned on. When the second transistor T2 is turned on, the data signal DATA of FIG. 2 may be output to the data output line DOL through the second transistor T2.

Figure 9:
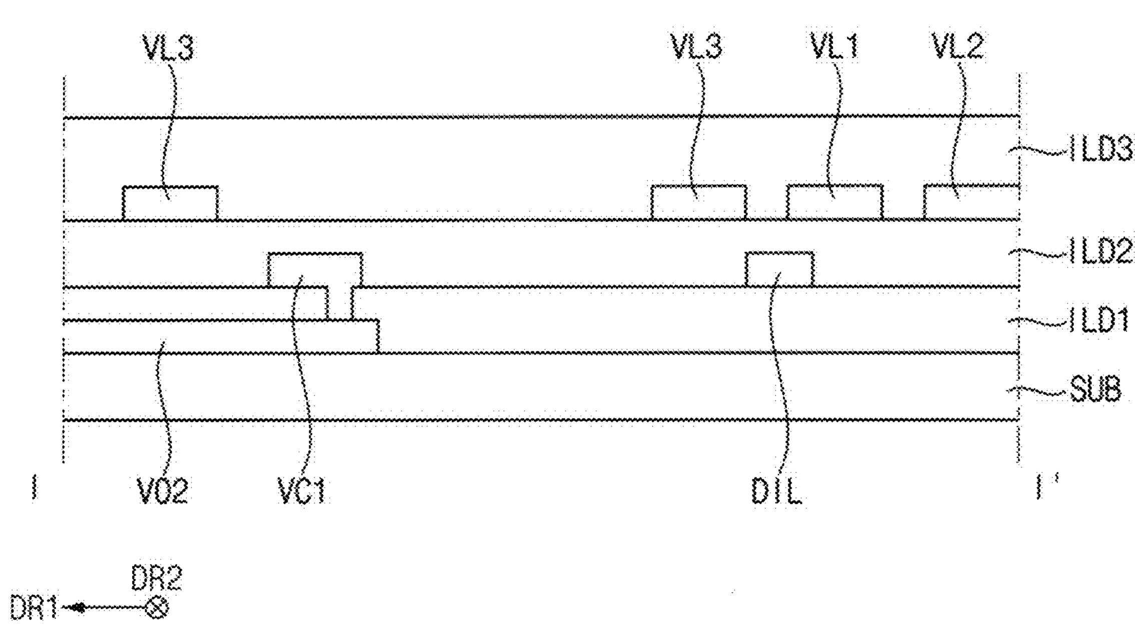
FIGS. 9 and 10 are cross-sectional views illustrating embodiments taken along line I-I' of FIG. 4.
Figure 10:
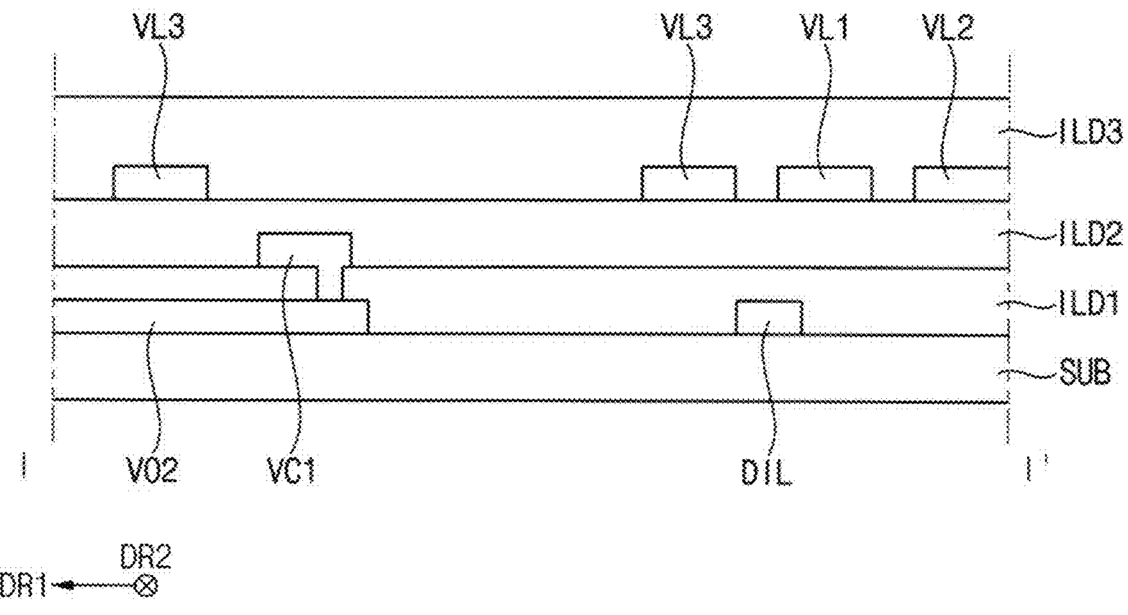

FIGS. 9 and 10 are cross-sectional views illustrating embodiments taken along line I-I' of FIG. 4. FIG. 10 may be substantially the same as FIG. 9 except for a location where the data input line DIL is disposed.

Referring to FIGS. 1, 2 4, 8A and 9, an embodiment of the display device may include a substrate SUB, a first interlayer insulating layer ILD1, a second interlayer insulating layer ILD2, a third interlayer insulating layer ILD3, a first voltage line VL1, a second voltage line VL2, a third voltage line and a data input line DIL.

The substrate SUB may include a plastic or a glass. In an embodiment where the substrate SUB includes the plastic, the display device may have flexible characteristics. In an embodiment where the substrate SUB includes the glass, the display device may have rigid characteristics.

The second voltage output line VO2 may be disposed on the substrate SUB. The initialization voltage VINT may be applied to the second voltage output line VO2. The second voltage output line VO2 may be connected to the pixel P disposed in the display area DA.

In an embodiment, as illustrated in FIG. 10, the data input line DIL may be disposed on the substrate SUB. In such an embodiment, the data input line DIL and the second voltage output line VO2 may be disposed in (or directly on) a same layer as each other.

Alternatively, as illustrated in FIG. 9, the data input line DIL may be disposed on the first interlayer insulating layer ILD1. In such an embodiment, the data input line DIL and the second voltage output line VO2 may be disposed in or (directly on) different layers from each other.

Alternatively, two or more data input lines DIL may be disposed on the substrate SUB. The two or more data lines DIL may be disposed in a same layer as or different layers from each other. In an embodiment, for example, one of the two or more data lines DIL may be disposed on the first interlayer insulating layer ILD1, and another of the two or more data lines DIL may be disposed between the first interlayer insulating layer ILD1 and the substrate SUB.

The first interlayer insulating layer ILD1 may be disposed on the substrate SUB to cover the second voltage output line VO2. The first interlayer insulating layer ILD1 may include an insulating material. In an embodiment, for example, the first interlayer insulating layer ILD1 may include an inorganic insulating material such as silicon oxide, silicon nitride, and silicon oxynitride.

The first voltage transmission line VC1 may be disposed on the first interlayer insulating layer ILD1. The initialization voltage VINT may be applied to the first voltage transmission line VC1. The first voltage transmission line VC1 may be connected to the second voltage output line VO2 through a contact hole, such that the initialization voltage VINT applied to the first voltage transmission line VC1 may flow to the second voltage output line VO2.

The second interlayer insulating layer ILD2 may be disposed on the first interlayer insulating layer ILD1 to cover the first voltage transmission line VC1 and the data input line DIL. The second interlayer insulating layer ILD2 may include an insulating material. In an embodiment, for example, the second interlayer insulating layer ILD2 may include an inorganic insulating material such as silicon oxide, silicon nitride, and silicon oxynitride.

The first to third voltage lines VL1, VL2, VL3 may be disposed on the second interlayer insulating layer ILD2. In an embodiment, different types of voltages may be applied to the first to third voltage lines VL1, VL2, VL3, respectively. In an embodiment, for example, the initialization voltage VINT may be applied to the first voltage line VL1, the low power voltage VSS may be applied to the second voltage line VL2, and the high power voltage VDD may be applied to the third voltage line VL3. In an alternative embodiment, the low power voltage VSS may be applied to the first voltage line VL1, the initialization voltage VINT may be applied to the second voltage line VL2, and the high power voltage VDD may be applied to the third voltage line VL3.

The third interlayer insulating layer ILD3 may be disposed on the second interlayer insulating layer ILD2 to cover the first to third voltage lines VL1, VL2, VL3. The third interlayer insulating layer ILD3 may include an insulating material. In an embodiment, for example, the third interlayer insulating layer ILD3 may include an inorganic insulating material such as silicon oxide, silicon nitride, and silicon oxynitride.

Figure 11:
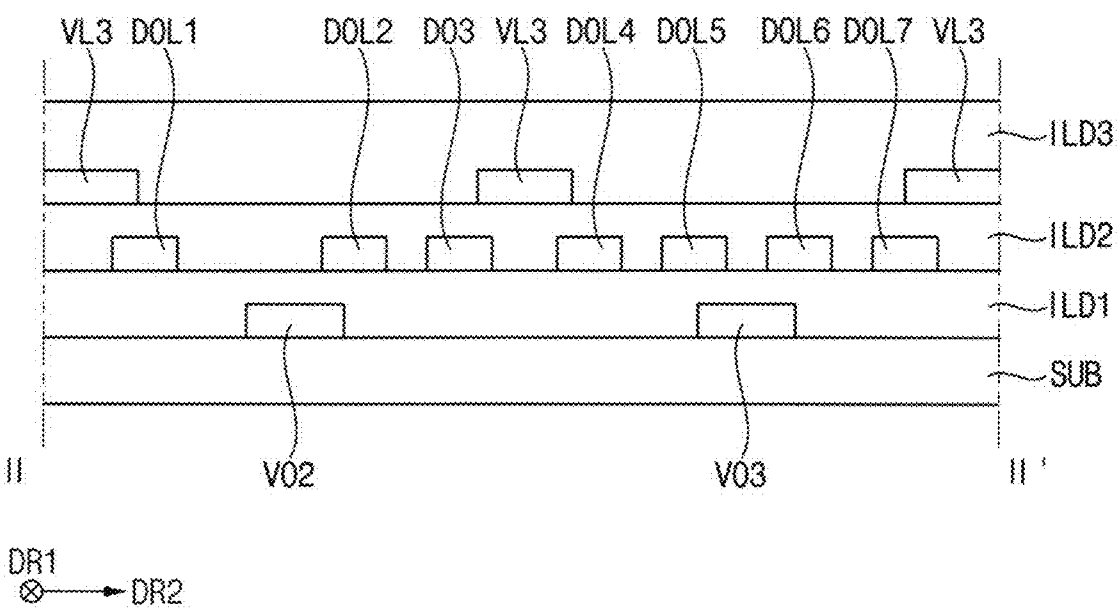
FIGS. 11, 12 and 13 are cross-sectional views illustrating embodiments taken along line II-II' of FIG. 4.
Figure 12:
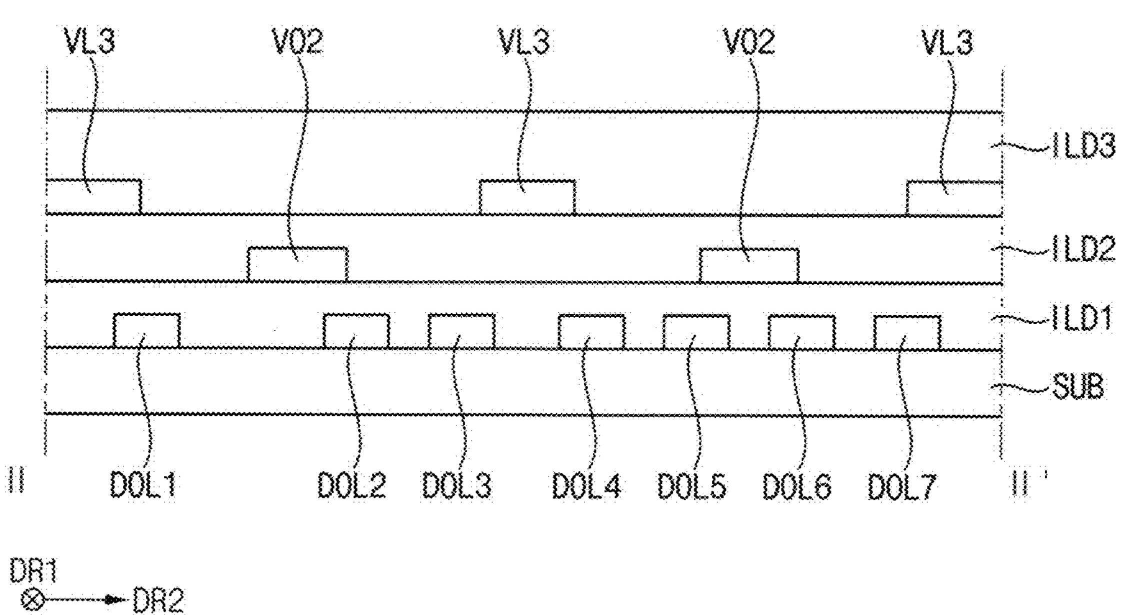
Figure 13:
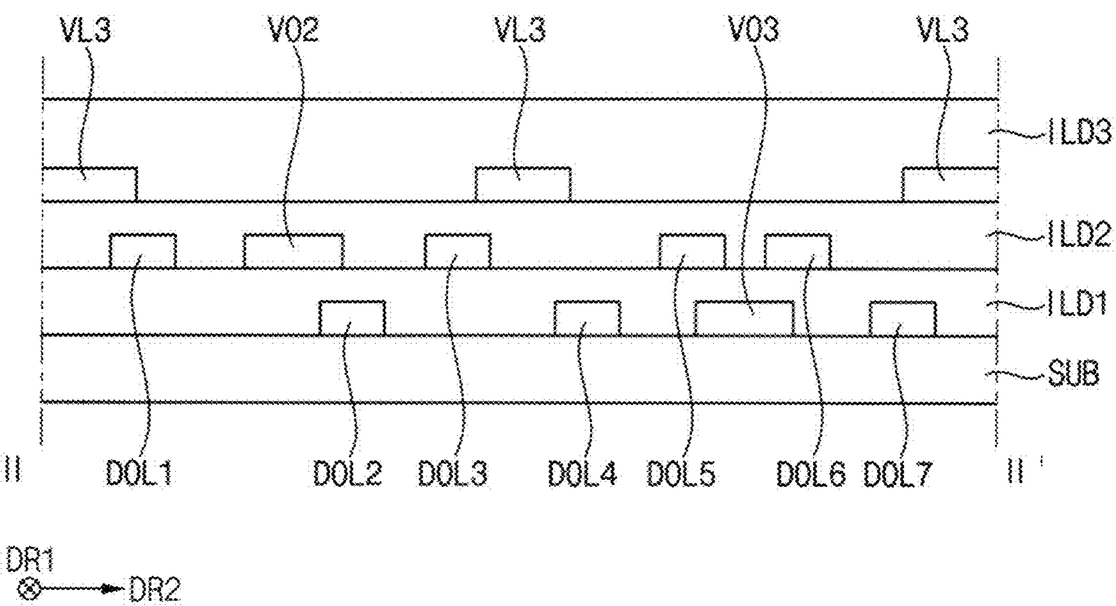

FIGS. 11, 12 and 13 are cross-sectional views illustrating embodiments taken along line II-II' of FIG. 4.

Referring to FIGS. 1, 2, 4, 8A and 11, an embodiment of the display device may include a substrate SUB, first to third interlayer insulating layer ILD1, ILD2, ILD3, a third voltage line VL3, a second voltage output line VO2, a third voltage output line VO3, and a plurality of data output lines DOL1, DOL2, DOL3, DOL4, DOL5, DOL6, DOL7.

The plurality of data output lines DOL1, DOL2, DOL3, DOL4, DOL5, DOL6, DOL7 may be disposed on the substrate SUB. The data signal DATA may be applied to the plurality of data output lines DOL1, DOL2, DOL3, DOL4, DOL5, DOL6, DOL7. The plurality of data output lines DOL1, DOL2, DOL3, DOL4, DOL5, DOL6, DOL7 may transmit the data signal DATA to the pixels P.

The first interlayer insulating layer ILD1 may be disposed on the substrate SUB to cover the plurality of data output lines DOL1, DOL2, DOL3, DOL4, DOL5, DOL6, DOL7. The first interlayer insulating layer ILD1 may include an insulating material.

In an embodiment, as illustrated in FIG. 11, the second voltage output line VO2 and the third voltage output line VO3 may be disposed on the plurality of data output lines DOL1, DOL2, DOL3, DOL4, DOL5, DOL6, DOL7.

Alternatively, as illustrated in FIG. 12, the plurality of data output lines DOL1, DOL2, DOL3, DOL4, DOL5, DOL6, DOL7 may be disposed on the second voltage output line VO2 and the third voltage output line VO3.

Alternatively, as illustrated in FIG. 13, some of the plurality of data output lines DOL2, DOL4, DOL7 and the rest of the plurality of data output lines DOL1, DOL3, DOL5, DOL6 may be disposed in different layers from each other. In such an embodiment, the second voltage output line VO2 and the third voltage output line VO3 may be disposed in different layers from each other.

In such an embodiment, the lines may be disposed in different layers from each other to minimize the non-display area NDA.

The second interlayer insulating layer ILD2 may be disposed on the first interlayer insulating layer ILD1 to cover the second voltage output line VO2 and the third voltage output line VO3. The second interlayer insulating layer ILD2 may include an insulating material.

The third voltage line VL3 may be disposed on the second interlayer insulating layer ILD2. The third voltage line VL3 illustrated in FIGS. 11 to 13 may correspond to the output unit VP of FIG. 4.

The third interlayer insulating layer ILD3 may be disposed on the second interlayer insulating layer ILD2 to cover the third voltage line VL3. The third interlayer insulating layer ILD3 may include an insulating material.

Figure 14:
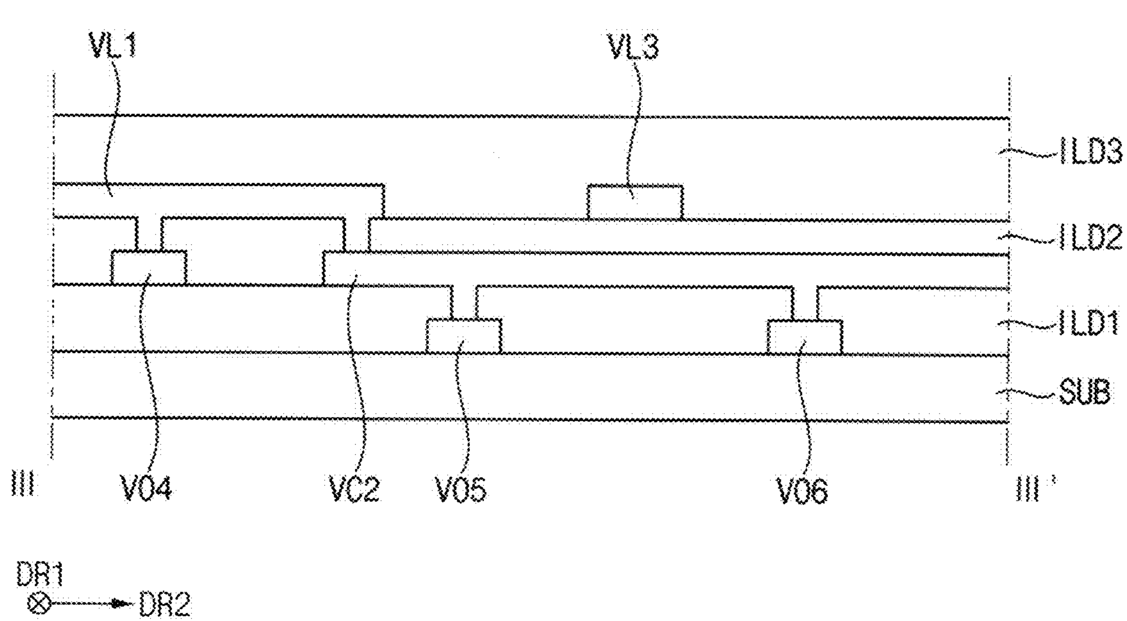
FIGS. 14 and 15 are cross-sectional views illustrating embodiments taken along line III-III' of FIG. 5.
Figure 15:
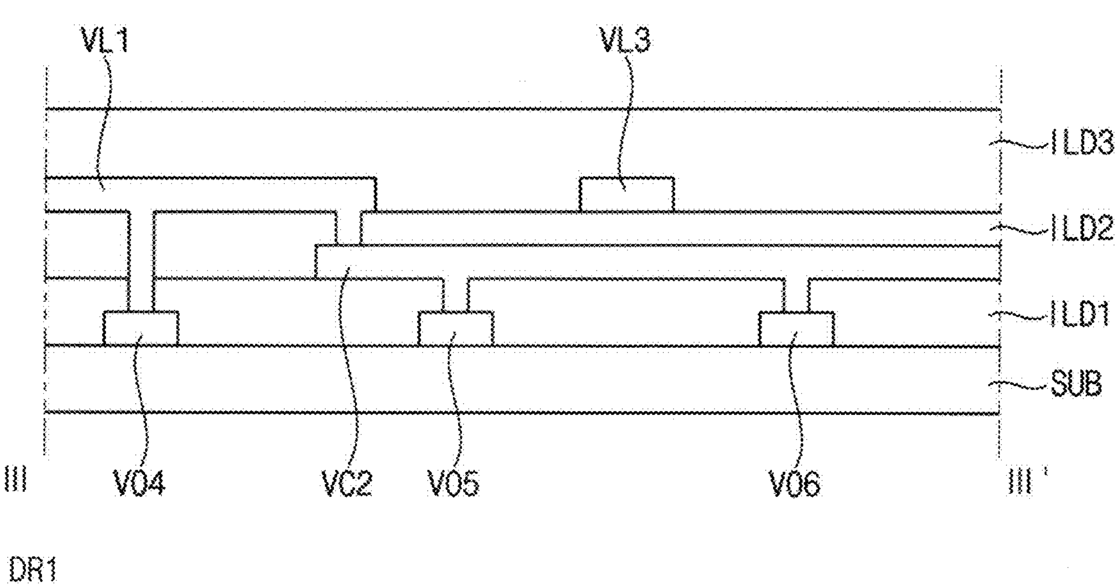

FIGS. 14 and 15 are cross-sectional views illustrating embodiments taken along line III-III' of FIG. 5.

Referring to FIGS. 1, 2, 5, and 15, an embodiment of the display device may include a substrate SUB, first to third interlayer insulating layers ILD1, ILD2, ILD3, fourth to sixth voltage output lines VO4, VO5, VO6, a first voltage line VL1, a third voltage line VL3 and a second voltage transmission line VC2.

The fifth voltage output line VO5 and the sixth voltage output line VO6 may be disposed on the substrate SUB. The initialization voltage VINT may be applied to the fifth voltage output line VO5 and the sixth voltage output line VO6.

The first interlayer insulating layer ILD1 may be disposed on the substrate SUB to cover the fifth voltage output line VO5 and the sixth voltage output line VO6. The first interlayer insulating layer ILD1 may include an insulating material.

The fourth voltage output line VO4 and the second voltage transfer line VC2 may be disposed on the first interlayer insulating layer ILD1. The initialization voltage VINT may be applied to the fourth voltage output line VO4 and the second voltage transfer line VC2, respectively.

The fourth voltage output line VO4 and the second voltage transmission line VC2 may be disposed on the first interlayer insulating layer ILD1. The initialization voltage VINT may be applied to the fourth voltage output line VO4 and the second voltage transmission line VC2, respectively.

The second interlayer insulating layer ILD2 may be disposed on the first interlayer insulating layer ILD1 to cover the fourth voltage output line VO4 and the second voltage transmission line VC2. The second interlayer insulating layer ILD2 may include an insulating material.

The first voltage line VL1 and the third voltage line VL3 may be disposed on the second interlayer insulating layer ILD2. The initialization voltage VINT may be applied to the first voltage line VL1. The first voltage line VL1 may be connected to the fourth voltage output line VO4 and the second voltage transmission line VC2, respectively, through a contact hole. The first voltage line VL1 may connect a fourth voltage output line VO4 and the second voltage transmission line VC2 to each other. The initialization voltage VINT applied to the first voltage line VL1 may be transferred to the fourth to sixth output lines VO4, VO5, VO6, respectively. The high power voltage ELVDD may be applied to the third voltage line VL3.

The third interlayer insulating layer ILD3 may be disposed on the second interlayer insulating layer ILD2 to cover the first voltage line VL1 and the third voltage line VL3. The third interlayer insulating layer ILD3 may include an insulating material.

Alternatively, as illustrated in FIG. 15, the fourth voltage output line VO4 may be disposed in a same layer as the fifth and sixth voltage output lines VO5, VO6. In such embodiments, lines may be disposed in various layers to minimize an area of the display device.

In an embodiment, as shown in FIGS. 9 to 15, the lines are disposed directly on the substrate, but not being limited thereto.

In one alternative embodiment, for example, an additional insulating layer (e.g., a buffer layer, a barrier layer, a gate insulating layer, an interlayer insulating layer, etc.) may be disposed on the substrate SUB, and the lines may be disposed on the additional insulating layer.

In an embodiment, an insulating layer and/or conductive layers may be further disposed on the substrate SUB, and the lines may be disposed on the insulating layer and/or the conductive layers.

Embodiments described herein may be applied to various display devices, for example, vehicle-display device, a ship-display device, an aircraft-display device, portable communication devices, display devices for display or for information transfer, a medical-display device, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a substrate on which a display area including a plurality of pixels and a non-display area surrounding the display area are defined;

a first voltage line disposed on the substrate in the non-display area, wherein the first voltage line provides a first voltage to the pixels;

a second voltage line disposed on the substrate in the non-display area, wherein the second voltage line provides a second voltage to the pixels; and a first demux circuit area and a second demux circuit area disposed on the substrate in the non-display area, wherein the first demux circuit area includes a plurality of first demux circuits and the second demux circuit area includes a plurality of second demux circuits, wherein the first demux circuits are connected to a first portion of a plurality of data lines transmitting data signals to the pixels, wherein the second demux circuits are connected to a second portion of the data lines, and wherein the first voltage line passes an area between the first demux circuit area and the second demux circuit area.

2. The display device of claim 1, wherein a first distance between the first demux circuit area and the second demux circuit area is longer than a second distance between adjacent ones of the first demux circuits.

3. The display device of claim 1, wherein the display area has a circular shape.

4. The display device of claim 1, further comprising:

a first voltage bypass line connected to the first voltage line and disposed along an edge of the display area, wherein the first voltage bypass line is electrically connected between the pixels and the first voltage line.

5. The display device of claim 4, further comprising:

a second voltage bypass line connected to the second voltage line and disposed along the edge of the display area, wherein the second voltage bypass line is electrically connected between the pixels and the second voltage line.

6. The display device of claim 4, further comprising:

a plurality of voltage output lines connected to the first voltage line, wherein the voltage output lines are electrically connected between the pixels and the first voltage line.

7. The display device of claim 6, wherein a first portion of the voltage output lines partially overlaps the first demux circuit area, and wherein a second portion of the voltage output lines partially overlaps the second demux circuit area.

8. The display device of claim 6, further comprising:

a voltage transmission line connected to the first voltage line, wherein the voltage transmission line is electrically connected between the voltage output lines and the first voltage line.

9. The display device of claim 8, wherein a first portion of the voltage transmission line at least partially overlaps the first demux circuit area, and wherein a second portion of the voltage transmission line at least partially overlaps the second demux circuit area.

10. The display device of claim 8, wherein the first voltage line and the voltage output lines are disposed in different layers from each other.

11. The display device of claim 8, wherein the first voltage line and the voltage transmission line are disposed in different layers from each other.

12. The display device of claim 8, wherein at least one of the voltage output lines and the voltage transmission line are disposed in different layers from each other.

13. The display device of claim 6, wherein the voltage output lines are disposed in a same layer as each other.

14. The display device of claim 6, wherein at least two of the voltage output lines are disposed in different layers from each other.

15. The display device of claim 1, wherein the first voltage is an initialization voltage applied to at least one of electrodes of transistors included in the pixels, and wherein the second voltage is a low power supply voltage applied to at least one of cathodes of organic light emitting diodes included in the pixels.

16. The display device of claim 1, wherein the first voltage is a low power voltage applied to at least one of cathodes of organic light emitting diodes included in the pixels, and wherein the second voltage is an initialization voltage applied to at least one of electrodes of transistors included in the pixels.

17. The display device of claim 1, wherein the first demux circuit area is disposed to be spaced apart from the second demux circuit area.

18. The display device of claim 1, further comprising:

a third voltage line disposed on the substrate in the non-display area, wherein the third voltage line provides a third voltage to the pixels, wherein the third voltage is a high power supply voltage higher than an initialization voltage.

19. The display device of claim 18, wherein a part of the third voltage line passes the area between the first demux circuit area and the second demux circuit area.

20. The display device of claim 19, wherein a width of the part of the third voltage line is narrower than a width of another part of the third voltage line connected to the part.

21. The display device of claim 1, further comprising:

a plurality of first data input lines connected to the first demux circuits; and a plurality of second data input lines connected to the second demux circuits, wherein a first data signal is applied to the first demux circuits through the first data input lines, and wherein a second data signal is applied through a second data input lines.

22. The display device of claim 21, wherein the first data input lines and the second data input lines are disposed in a same layer as each other.

23. The display device of claim 21, wherein the first data input lines and the second data input lines are disposed in different layers from each other.

24. The display device of claim 21, further comprising:

a plurality of first data output lines connected to the first demux circuits; and a plurality of second data output lines connected to the second demux circuits, wherein the first data signal is transferred to the pixels through the first data output lines, and wherein the second data signal is transferred to the pixels through the second data output lines.

25. The display device of claim 24, wherein the first data output lines and the second data output lines are disposed in a same layer as each other.

26. The display device of claim 24, wherein the first data output lines and the second data output lines are disposed in different layers from each other.

27. The display device of claim 1, wherein the first voltage line includes a first part disposed between the first demux circuit area and the second demux circuit area, and a second part connected to the first part, and a width of the first part is narrower than a width of the second part.

* * * * *